(12) United States Patent
Tsukada

(10) Patent No.: US 8,669,789 B2
(45) Date of Patent: Mar. 11, 2014

(54) SEMICONDUCTOR DEVICE DRIVING UNIT AND METHOD

(75) Inventor: Yoshinari Tsukada, Tochigi (JP)

(73) Assignee: Honda Motor Co., Ltd., Tokyo (JP)

( * ) Notice: Subject to any disclaimer, the term of this patent is extended or adjusted under 35 U.S.C. 154(b) by 40 days.

(21) Appl. No.: 13/198,762

(22) Filed: Aug. 5, 2011

(65) Prior Publication Data

US 2012/0032710 A1    Feb. 9, 2012

(30) Foreign Application Priority Data

Aug. 9, 2010 (JP) ................................. 2010-178784

(51) Int. Cl.
*H03B 1/00* (2006.01)
*H03K 3/00* (2006.01)

(52) U.S. Cl.
USPC .......................................... 327/108; 327/112

(58) Field of Classification Search
USPC ................................................ 327/108–112
See application file for complete search history.

(56) References Cited

U.S. PATENT DOCUMENTS 5,926,012 A    7/1999  Takizawa et al.
7,839,185 B2 *  11/2010  Schwarzer .................... 327/109
2008/0204087 A1 *  8/2008  Schwarzer .................... 327/109
2010/0008113 A1    1/2010  Kuno et al.
2012/0068627 A1 *  3/2012  Brooks ........................ 315/309

FOREIGN PATENT DOCUMENTS

| EP | 0814564 | 12/1997 |
|---|---|---|
| EP | 2197111 | 6/2010 |
| JP | 10-150764 | 6/1998 |
| JP | 2007-306166 | 11/2007 |
| JP | 2008-078816 | 4/2008 |
| JP | 2009-253699 | 10/2009 |
| WO | 2008/032113 | 3/2008 |

OTHER PUBLICATIONS

Japanese Office Action issued Oct. 8, 2013, 2 pages.

* cited by examiner

*Primary Examiner* — Lincoln Donovan
*Assistant Examiner* — Diana J Cheng
(74) *Attorney, Agent, or Firm* — Rankin, Hill & Clark LLP

(57) ABSTRACT

A semiconductor device (11) having a switching function of being turned on or off according to a voltage (Vge) of a driving signal supplied to a gate thereof is driven by generating a feedback voltage ($V_{FE}$) based on a time change (dI/dt) of a collector current (Ic) of the semiconductor device (11) and applying the feedback voltage ($V_{FE}$) as part of the voltage (Vge) of the driving signal when the semiconductor device (11) is switched from on to off.

9 Claims, 7 Drawing Sheets

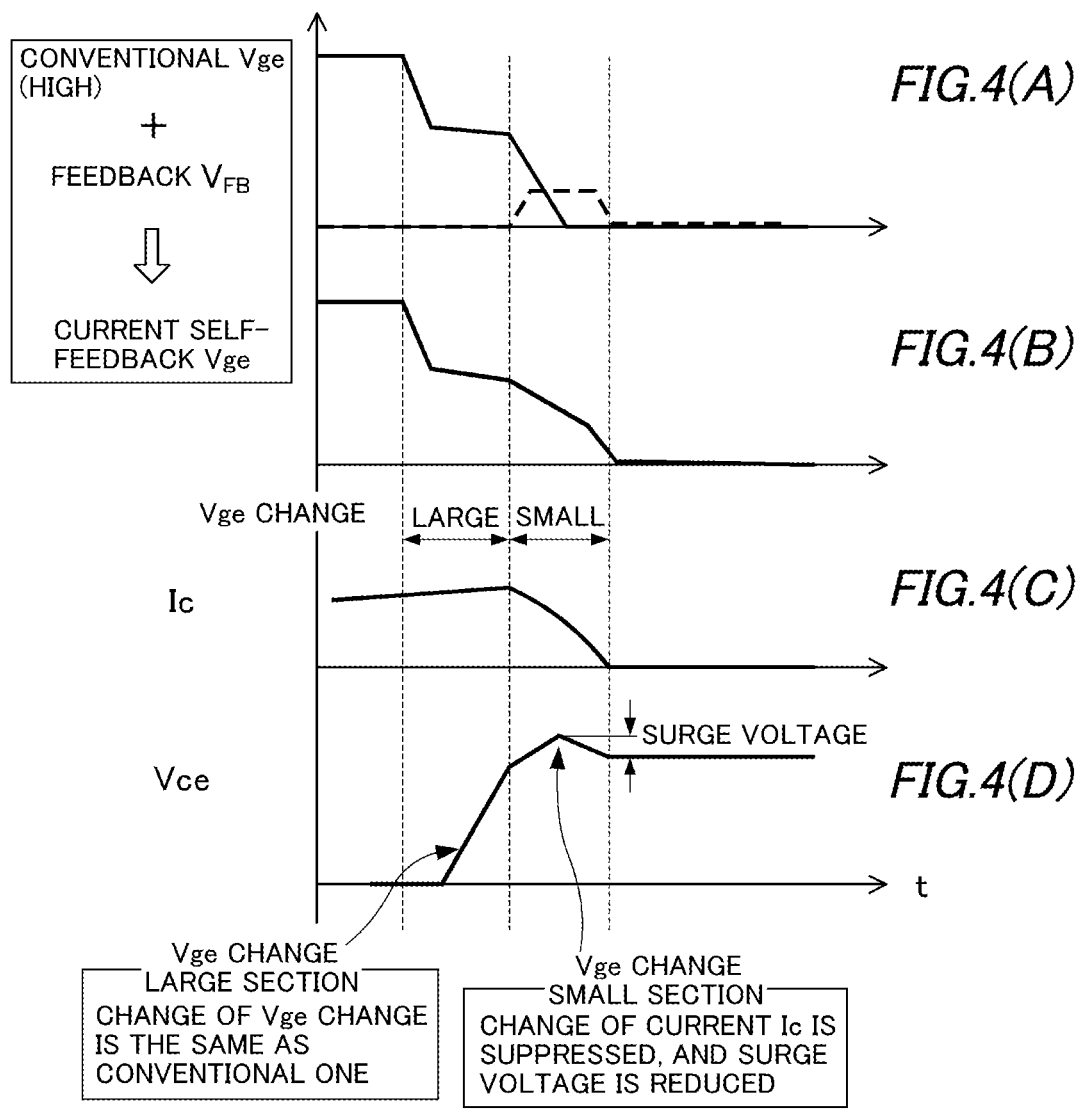

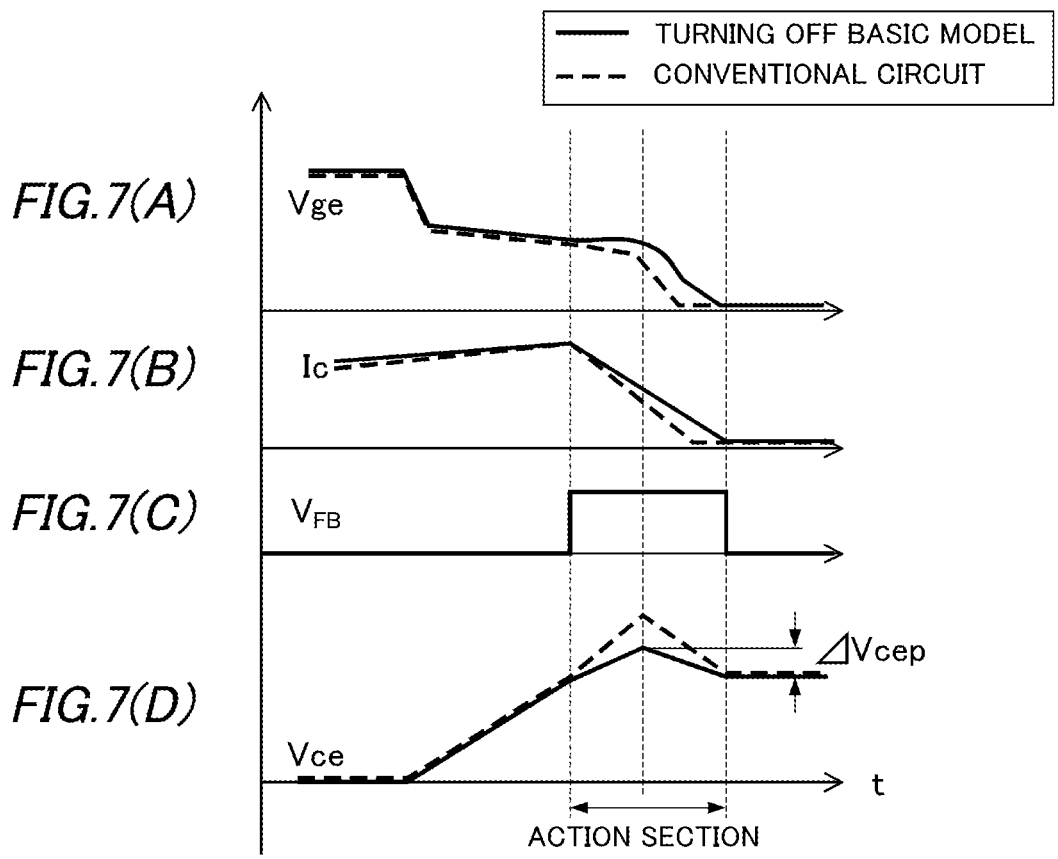
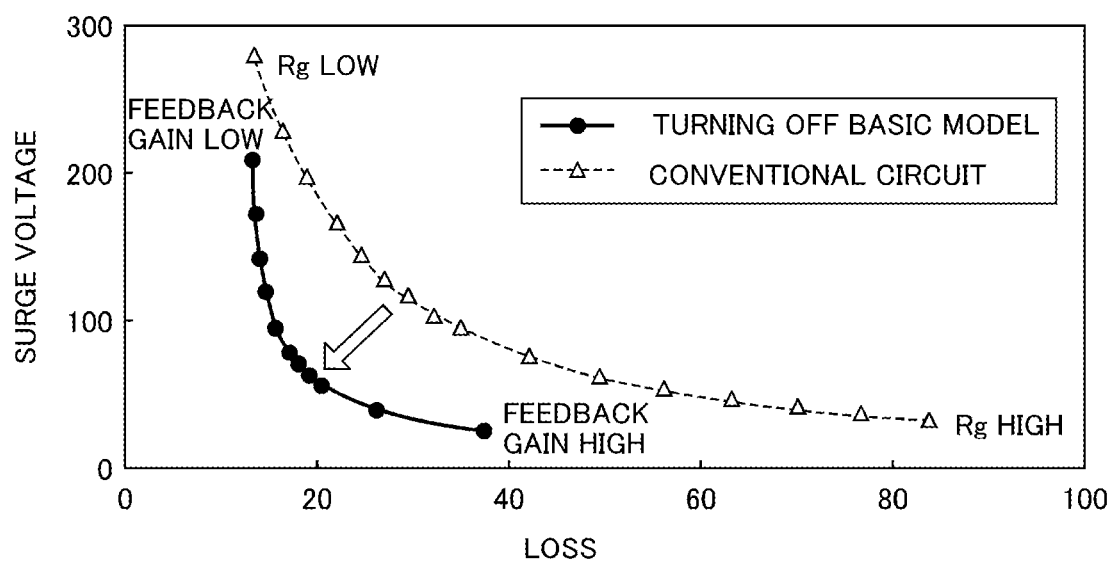

SEMICONDUCTOR DEVICE DRIVING UNIT AND METHOD

BACKGROUND OF THE INVENTION

1. Field of the Invention

The present invention relates to a unit and a method for driving a semiconductor device having a switching function. Specifically, the present invention relates to a unit and a method for driving a semiconductor device, capable of reducing a surge voltage while suppressing an increase in switching loss at the time of switching of the semiconductor device.

2. Related Art

Conventionally, in an electric vehicle, a synchronous electric motor driven by three-phase alternating current is typically used. Thus, the electric vehicle is provided with an inverter that converts the direct-current output from a battery (direct-current power source) into three-phase alternating current to drive the synchronous electric motor. The inverter provided in the electric vehicle will particularly be referred to as "electric vehicle inverter".

Many electric vehicle inverters adopt PWM (pulse width modulation) control, and adopt an IGBT (insulated gate bipolar transistor) as a power semiconductor device for implementing the PWM control (see Patent documents 1 to 3).
Patent Document 1: JP-A-2007-306166
Patent Document 2: JP-A-2008-078816
Patent Document 3: US2010/0008113

The IGBT is a self-turn-off semiconductor device driven by a gate-emitter voltage Vge and capable of being turned on and off in response to an input signal to the gate.

Here, turn-off switching is switching of a state between a collector and an emitter of the IGBT from conduction state to shut-off state. Turn-on switching is switching of a state between the collector and the emitter of the IGBT from shut-off state to conduction state.

In the electric vehicle inverter, for such an IGBT, an FWD (free wheeling diode) is used so as to be paired therewith. That is, the FWD is a free wheeling diode for the IGBT, and is connected in parallel to the IGBT in a direction opposite to the input and output direction of the IGBT.

Moreover, in the electric vehicle inverter, a circuit that drives the IGBT (hereinafter, referred to as "semiconductor device driving circuit") is provided. That is, the semiconductor device driving circuit controls the turning on and off of the IGBT by changing the value of the gate-emitter voltage Vge of the IGBT.

However, a surge voltage occurs during the transition period at the time of switching such as the turning on or off of the IGBT. Hereinafter, brief description of the surge voltage will be given.

A floating inductance is present in a circuit (bus) to which the IGBT is connected. Such a floating inductance becomes an inertial force on the current, and acts in such a way as to hinder the current from changing. Therefore, if the current behaves in a way as to abruptly decrease, in the floating inductance, an electromotive force occurs in a direction that hinders the current from decreasing. That is, in the electric vehicle inverter, an electromotive force occurs in a direction in which it is added to the power supply voltage of the battery in series. The voltage based on the electromotive force occurring in this way is called "surge voltage".

In the electric vehicle inverter, with two series-connected IGBTs as one unit, for three phases of load of the synchronous electric motor, a plurality of units, for example three units, are used in a state of being connected in parallel. Within one unit, when one IGBT is turned on, the other IGBT is turned off. Therefore, during the transition period at the time of switching within one unit, since the collector current of one of the IGBTs abruptly decreases, a high surge voltage occurs and is superimposed on the power supply voltage, and this is applied between the collector and emitter of the IGBT.

For this reason, it is necessary for the IGBT to have an element withstand voltage capable of tolerating such a surge voltage. Therefore, naturally, the higher the surge voltage is, the higher the required element withstand voltage is, so that the size of the IGBT increases. In the case of industrial inverters used in plants and the like, since there is sufficient installation space in plants, a large-size IGBT can be adopted. However, in the case of the electric vehicle inverter, it is difficult to ensure such installation space in electric vehicles, so that it is extremely difficult to adopt a large-size IGBT.

Therefore, it is required that the IGBT provided in the electric vehicle inverter be downsized. To downsize the IGBT, conversely, the element withstand voltage is held down. To do this, the surge voltage is reduced.

As described above, since the surge voltage occurs due to abrupt reduction in current, the surge voltage can be reduced by making sluggish the degree of change of the current reduction. That is, when the rise and fall times of the current and voltage at the time of switching of the IGBT will hereinafter be called "switching speed", the surge voltage can be reduced by reducing the switching speed.

However, if the switching speed is reduced to reduce the surge voltage, the loss of the IGBT and FWD during the transition period at the time of switching (hereinafter, referred to as "switching loss") is increased in turn.

On the other hand, if the switching speed is increased to reduce the switching loss, the surge voltage is increased as described above.

As described above, there is a relationship of trade-off (trade-off requirement) between the surge voltage and the switching loss. Hereinafter, the characteristic of the surge voltage and switching loss having such a relationship therebetween will be referred to as "trade-off characteristic of the surge voltage and switching loss".

Therefore, it is demanded of the electric vehicle inverter that the trade-off characteristic of the surge voltage and switching loss be improved, in other words, the surge voltage be reduced while the increase in switching loss is suppressed at the time of switching of the IGBT.

To satisfy this demand, some methods are disclosed in Patent Documents 1 to 3. However, it is difficult to say that these conventional methods sufficiently satisfy the demand. Therefore, the situation is such that a new method capable of sufficiently satisfying the demand is required.

While the electric vehicle inverter has been described as an example, downsizing is required not only of the electric vehicle inverter but also of various devices adopting semiconductor devices having a switching function. Therefore, the situation is such that the new method capable of sufficiently satisfying the demand is also required to be not only applicable to the IGBT of the electric vehicle inverter but also widely applicable to semiconductor devices having a switching function.

SUMMARY OF THE INVENTION

One or more embodiments of the invention provide a unit and a method for driving a semiconductor device having a switching function, which are capable of reducing a surge voltage while suppressing an increase in switching loss at a time of switching of the semiconductor device.

In accordance with one or more embodiments of the invention, a semiconductor device 11 having a switching function of being turned on or off according to a voltage Vge of a driving signal supplied to a gate thereof may be driven by generating a feedback voltage $V_{FE}$ based on a time change dI/dt of a collector current Ic of the semiconductor device 11 and applying the feedback voltage $V_{FE}$ as part of the voltage Vge of the driving signal when the semiconductor device 11 is switched from on to off.

Other aspects and advantages of the invention will be apparent from the following description and the appended claims.

BRIEF DESCRIPTION OF THE DRAWINGS

FIGS. 4(A) to 4(D) are timing charts showing a manner of gate driving at the time of turning off of an IGBT when the "di/dt self-feedback operation" is applied;

FIGS. 7(A) to 7(D) are timing charts showing results of the operation at the turning off of each of the electronic circuit of the turning off basic model of FIG. 6 and a conventional electronic circuit;

FIG. 8 is a view showing an example of the relationship between the surge voltage and the loss at the time of turning off of each of the electronic circuit of the turning off basic model of FIG. 6 and the conventional electronic circuit.

DETAILED DESCRIPTION OF EMBODIMENT

Hereinafter, an embodiment of the present invention will be described with reference to the drawings.

Figure 1:
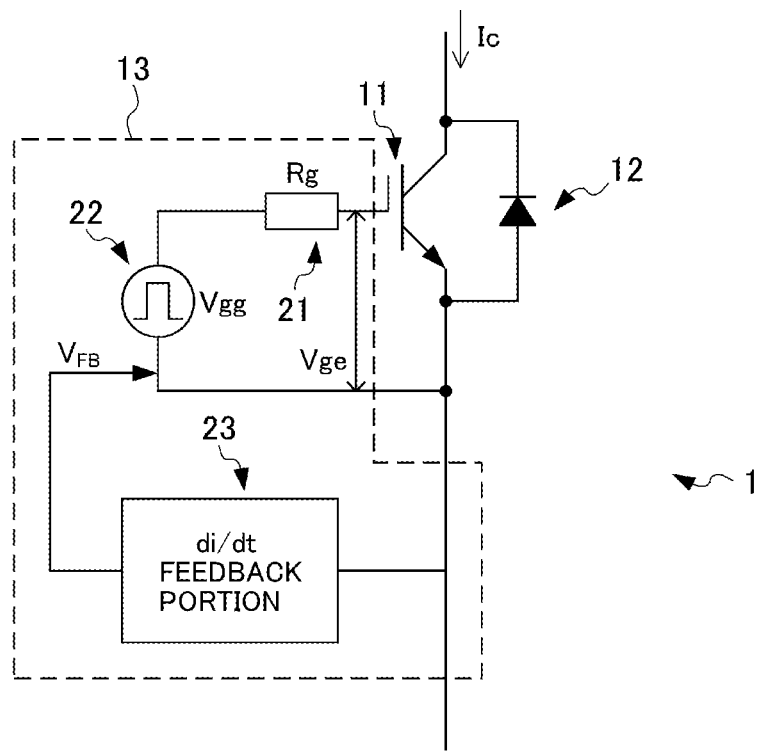
FIG. 1 is a view showing a schematic structure of an embodiment of an electronic circuit including a semiconductor device driving circuit to which a "di/dt self-feedback operation" is applied.

FIG. 1 is a view showing the schematic structure of the embodiment of an electronic circuit 1 including a semiconductor device driving circuit 13.

The electronic circuit 1 is adoptable, for example, as part of a power module of the electric vehicle inverter. The electronic circuit 1 is provided with an IGBT 11, an FWD 12 and the semiconductor device driving circuit 13.

The IGBT 11 and the FWD 12 are connected in parallel to each other in such a way that the input and output directions thereof are opposite to each other.

The IGBT 11 has a switching function of connecting and shutting off the bus such as the power line of the inverter, and is turned on or off according to the magnitude of the voltage of the driving signal supplied to the gate of the IGBT 11, that is, according to the magnitude of the gate-emitter voltage Vge. The semiconductor device driving circuit 13 controls the turning on and off of the IGBT 11 by changing the gate-emitter voltage Vge of the IGBT 11.

The semiconductor device driving circuit 13 is provided with a gate resistor 21, a voltage source 22 and a di/dt feedback portion 23.

The voltage source 22 outputs a gate voltage Vgg, and has one terminal connected to the emitter of the IGBT 11 and its other terminal connected to the gate of the IGBT 11 through the gate resistor 21.

That is, the gate resistor 21 has one terminal connected to the voltage source 22 and its other terminal connected to the gate of the IGBT 11. The gate resistor 21 has the functions of suppressing the vibration of the gate-emitter voltage Vge of the IGBT 11 which vibration is seen during the transition period of turning on and turning off and of adjusting the switching speed or the like of the IGBT 11 according to the resistance value Rg.

When the voltage source 22 makes the gate voltage Vgg high, the gate-emitter voltage Vge of the IGBT 11 also becomes high, so that the IGBT 11 is turned on. On the other hand, when the voltage source 22 makes the gate voltage Vgg low, the gate-emitter voltage Vge of the IGBT 11 also becomes low, so that the IGBT 11 is turned off.

The di/dt feedback portion 23 generates a feedback voltage VFB based on the time change of the current flowing on the bus to which the IGBT 11 is connected, and adds it as part of the gate-emitter voltage Vge of the IGBT 11, that is, as part of the voltage of the driving signal.

Specifically, in this structure, the di/dt feedback portion 23 generates the feedback voltage VFB based on the time change, that is, the temporal differentiation value dIc/dt of a collector current Ic of the IGBT 11 which is the main current of the electronic circuit 1, and adds it as part of the gate-emitter voltage Vge of the IGBT 11.

Such an operation of the di/dt feedback portion 23 is an operation to which the present invention is applied, and will specifically be called "di/dt self-feedback operation" to make a distinction from conventional other operations.

Now, the "di/dt self-feedback operation" will be described in more detail.

Expressions (1) to (11) are expressions explaining the principle of the "di/dt self-feedback operation".

[Expression 1]

$$I_{ce\_sat} = gm \cdot (V_{ge} - V_{Th}) \qquad (1)$$

In the expression (1), Ice is the collector-emitter current (equivalent to the collector current Ic) of the IGBT 11, gm is the mutual conductance of the IGBT 11, Vge is the gate-emitter voltage of the IGBT 11, and VTh is the threshold voltage of the IGBT 11.

The expression (2) is obtained from the expression (1).

[Expression 2]

$$\frac{dI_{ce}}{dt} = gm \cdot \frac{dV_{ge}}{dt} + \frac{dgm}{dt} \cdot V_{ge} \qquad (2)$$

As shown by the expression (2), the time change of the collector-emitter current IcE of the IGBT 11 depends on the time changes of the gate-emitter voltage Vge of the IGBT 11 and the mutual conductance gm of the IGBT 11.

The mutual conductance gm of the IGBT 11 is represented as the expression (3).

[Expression 3]

$$gm = \frac{\partial I_{ce\_sat}}{\partial V_{ge}}\bigg|_{V_{DS}=const} = \frac{1}{1-\alpha_{PNP}} \cdot \frac{\mu_{ns} \cdot C_{ox}}{L_{ch}} \cdot (V_{ge} - V_{Th}) \quad (3)$$

In the expression (3), PNP is the emitter injection efficiency, and ns is the average mobility of the intra-channel electrons.

The expression (4) is obtained from the expression (3).

[Expression 4]

$$\frac{dgm}{dt} = \frac{1}{1-\alpha_{PNP}} \cdot \frac{\mu_{ns} \cdot C_{ox}}{L_{ch}} \cdot \frac{dV_{ge}}{dt} \quad (4)$$

Here, K is defined as shown by the expression (5).

[Expression 5]

$$K = \frac{1}{1-\alpha_{PNP}} \cdot \frac{\mu_{ns} \cdot C_{ox}}{L_{ch}} \quad (5)$$

The expression (6) is obtained from the expressions (2) to (5).

[Expression 6]

$$\frac{dI_{ce}}{dt} = K \cdot (V_{ge} - V_{Th}) \cdot \frac{dV_{ge}}{dt} + K \cdot \frac{dV_{ge}}{dt} \cdot (V_{ge} - V_{Th}) = \quad (6)$$
$$2 \cdot K \cdot (V_{ge} - V_{Th}) \cdot \frac{dV_{ge}}{dt} = 2 \cdot gm \cdot \frac{dV_{ge}}{dt}$$

The gate-emitter voltage Vge of the IGBT 11 is represented as the expression (7).

[Expression 7]

$$V_{ge} = V_{bias} + V_{FB} - R_g \cdot i_g \quad (7)$$

In the expression (7), VFB is the feedback voltage. When the gate resistance Rg=0 for simplification, the expression (8) is obtained from the expression (7).

[Expression 8]

$$\frac{dV_{ge}}{dt} = \frac{dV_{bias}}{dt}(=0) + \frac{dV_{FB}}{dt} = \frac{dV_{FB}}{dt} \quad (8)$$

The expression (9) is obtained from the expression (8).

[Expression 9]

$$\frac{dI_{ce}}{dt} = 2 \cdot gm \cdot \frac{dV_{FB}}{dt} \quad (9)$$

From the expression (9), it is found that the gain (magnitude) is proportional to 2 gm and the time change, that is, the temporal differentiation value dIc/dt of the collector-emitter current Ice (equivalent to the collector current Ic) of the IGBT 11 is proportional to the feedback voltage FB.

When a voltage proportional to the time change, that is, the temporal differentiation value dIc/dt of the collector-emitter current Ice (equivalent to the collector current Ic) of the IGBT 11 is fed back as the feedback voltage VFB, the expression (10) and the expression (11) are obtained.

[Expression 10]

$$V_{FB} = A_{gain} \cdot \frac{dI_{ce}}{dt} \quad (10)$$

[Expression 11]

$$\frac{dI_{ce}}{dt} = 2 \cdot gm \cdot A_{gain} \cdot \frac{d^2 I_{ce}}{dt^2} \quad (11)$$

From the expression (11), it is found that the time change, that is, the temporal differentiation value dIc/dt of the collector-emitter current Ice (equivalent to the collector current Ic) of the IGBT 11 is proportional to its own second order differential.

As described above, in the "di/dt self-feedback operation", the voltage proportional to the time change, that is, the temporal differentiation value dIc/dt of the collector current Ic of the IGBT 11 becomes the feedback voltage VFB and is added as part of the gate-emitter voltage Vge of the IGBT 11. Thereby, in an area where the generation of the surge voltage of the IGBT 11 is started and the time change of the collector current Ic is inflected, the highest gain can be obtained, that is, dIc/dt can be acted upon.

Figure 2:
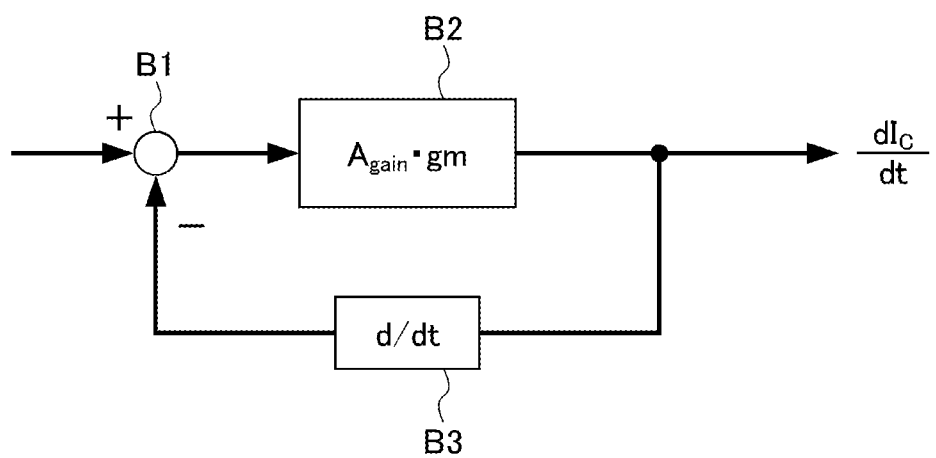
FIG. 2 shows a control block capable of implementing the "di/dt self-feedback operation"

FIG. 2 shows a control block obtained by the expressions (10) and (11) shown above, that is, a control block capable of implementing the "di/dt self-feedback operation".

As shown in FIG. 2, the "di/dt self-feedback operation" is implemented by a feedback loop control system including an addition block B1, a gain block B2 and a temporal differentiation block B3.

The addition block B1 corresponds to the gate of the IGBT 11. That is, in the addition block B1, the positive (+) input corresponds to the input from the voltage source 22 to the gate of the IGBT 11, and the negative (−) input corresponds to the input from the di/dt feedback portion 23 to the gate of the IGBT 11.

The input from the di/dt feedback portion 23 to the gate of the IGBT 11 becomes voltage information which is the time change, that is, the temporal differentiation value dIc/dt of the collector current Ic of the IGBT 11 further temporally differentiated at the temporal differentiation block B3.

As described above, the "di/dt self-feedback operation" is implemented by negatively feeding back, to the gate of the IGBT 11, the voltage information which is the further temporally differentiated temporal differentiation value dIc/dt of the collector current Ic of the IGBT 11.

Here, the polarity of the feedback voltage VFB is, when the IGBT 11 is turned on, in a direction that reduces the gate-emitter voltage Vge of the IGBT 11, and is, when the IGBT 11 is turned off, in a direction that increases the gate-emitter voltage Vge of the IGBT 11. That is, the surge voltage from the IGBT 11 is automatically suppressed by the gate-emitter voltage Vge of the IGBT 11 automatically increasing or decreasing according to the degree of the current change so that the inflection point of the time change of the current (the second order temporal differentiation of the current) is zero at the gate of the IGBT 11. Further, although the condition of the time change, that is, the temporal differentiation value dIc/dt of the collector current Ic of the IGBT 11 changes from moment to moment, since this momentarily changing condition is fed back, the gate-emitter voltage Vge of the IGBT 11 is optimally adjusted at all times.

The feedback gain in this case is determined by the product of the gain of the gain block B2, that is, a control gain Again preset in the feedback loop control system and the mutual conductance gm that the IGBT 11 has.

Since the mutual conductance gm of the IGBT 11 generally has a high gain, even a comparatively low value of control gain Again affects the current change, so that an action occurs that ideally improves the trade-off characteristic of the surge voltage and switching loss. Further, the piece-to-piece variation in the switching speed of the IGBT 11 is automatically optimized by this action.

That is, while the conventional technology of Patent Document 1 requires that the control parameter be adjusted to the worst value of the IGBT, the application of the "di/dt self-feedback operation" enables the IGBT 11 to be automatically driven in optimum state at all times irrespective of individual variability.

As described above, by applying the "di/dt self-feedback operation", the trade-off characteristic of the surge voltage and switching loss can be improved.

Now, referring to FIG. 3, details of the trade-off characteristic of the surge voltage and switching loss will be described by describing a commonly performed conventional method (hereinafter, referred to as "conventional method").

Figures 3A, 3B:
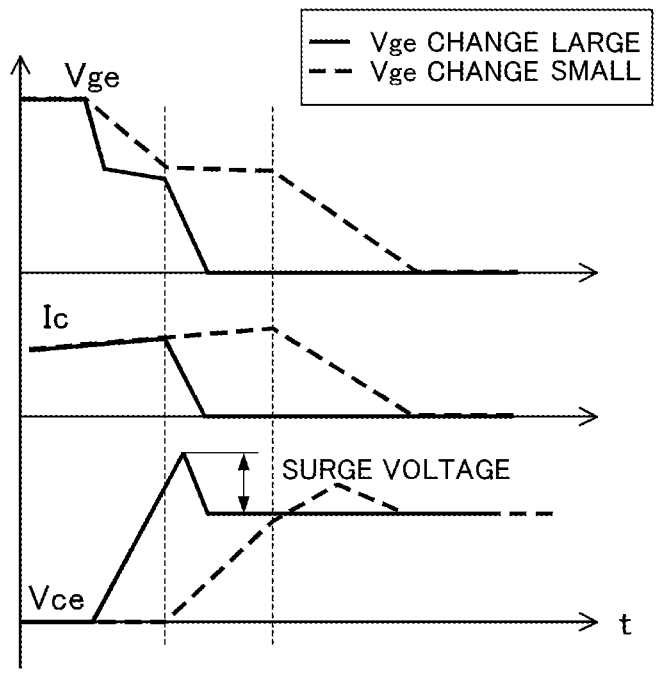
FIGS. 3(A) and 3(B) are views explaining a conventional method in which a trade-off characteristic of the surge voltage and switching loss occurs.

FIGS. 3(A) and 3(B) are views explaining the conventional method in which the trade-off characteristic of the surge voltage and switching loss occurs.

FIG. 3(A) is timing charts showing a manner of gate driving at the time of turning off of the IGBT when the conventional method is applied. Specifically, in FIG. 3(A), from above, timing charts of the gate-emitter voltage Vge, the collector current Ic and the collector-emitter voltage Vce are shown.

In each of the timing charts of FIG. 3(A), the solid line represents the waveform when the degree of change of the gate-emitter voltage Vge is relatively high, and the broken line represents the waveform when the degree of change of the gate-emitter voltage Vge is relatively low.

FIG. 3(B) shows the correspondence relationship between the magnitude of the degree of change of the gate-emitter voltage Vge, and the surge voltage and the switching loss.

As shown in FIG. 3(A), the manner in which the collector current Ic and the collector-emitter voltage Vce change differs according to the magnitude of the degree of change of the gate-emitter voltage Vge.

Therefore, according to the conventional method, by uniquely determining the degree of change of the gate-emitter voltage Vge by the resistance value Rg of the gate resistance (corresponding to the gate resistor 21 of FIG. 21), the manner in which the collector current Ic and the collector-emitter voltage Vge change is determined, and thereby, the degree of the surge voltage and switching characteristic is determined.

That is, if the degree of change of the gate-emitter voltage Vge during the transition period is increased, as shown in FIGS. 3(A) and 3(B), the speed of change of the collector current Ic is increased, so that the surge voltage is increased. On the other hand, as the rising and falling speeds of each of the collector current Ic and the collector-emitter voltage Vce become steeper, the switching loss becomes lower.

Conversely, if the degree of change of the gate-emitter voltage Vge during the transition period is decreased, as shown in FIGS. 3(A) and 3(B), the speed of change of the collector current Ic is decreased, so that the surge voltage is decreased. On the other hand, as the rising and falling speeds of each of the collector current Ic and the collector-emitter voltage Vce become more sluggish, the switching loss becomes higher.

According to the conventional method, only one of the state where the degree of change of the gate-emitter voltage Vge during the transition period is increased and the state where the degree is decreased can be selected. Therefore, even though one of the characteristics of the surge voltage and switching loss can be decreased, the other characteristic is increased as the trade-off.

That is, when the conventional method is applied, there is a relationship of trade-off between the surge voltage and the switching loss, and the characteristic of only one of them can be improved. The characteristics of the surge voltage and the switching loss having such a relationship therebetween are the one called the trade-off characteristic of the surge voltage and switching loss.

Such a trade-off characteristic of the surge voltage and switching loss can be improved by applying the "di/dt self-feedback operation".

FIGS. 4(A) to 4(D) are timing charts showing a manner of gate driving at the time of turning off of the IGBT 11 when the "di/dt self-feedback operation" is applied.

FIG. 4(A) is a timing chart of the conventional gate-emitter voltage Vge when the "di/dt self-feedback operation" is not applied, and the feedback voltage VFB caused by the "di/dt self-feedback operation". That is, in FIG. 4(A), the solid line represents the waveform of the conventional gate-emitter voltage Vge, and the broken line represents the waveform of the feedback voltage VFB.

FIG. 4(B) is a timing chart of the gate-emitter voltage Vge when the "di/dt self-feedback operation" is applied. That is, although easily understood when FIGS. 4(A) and 4(B) are compared, the gate-emitter voltage Vge when the "di/dt self-feedback operation" is applied is a voltage which is the sum of the conventional gate-emitter voltage Vge and the feedback voltage VFB, and will hereinafter be referred to as "current self-feedback gate-emitter voltage Vge".

FIG. 4(C) is a timing chart of the collector current Ic.

FIG. 4(D) is a timing chart of the collector-emitter voltage Vce.

As shown in FIGS. 4(A) and 4(C), when the change of the collector current Ic is small, the temporal differentiation value dIc/dt thereof is close to zero. Consequently, the feedback voltage VFB is also close to zero, so that the current self-feedback gate-emitter voltage Vge is substantially the same as the conventional gate-emitter voltage Vge. For this reason, the degree of change of the current self-feedback gate-emitter voltage Vge is substantially as high as that of the conventional gate-emitter voltage Vge.

Thereby, the rising speed of the collector-emitter voltage Vce is substantially as steep as the conventional one, so that the switching loss is low.

Thereafter, when the collector current Ic starts to decrease, the temporal differentiation value dIc/dt thereof becomes not less than a predetermined value. Consequently, a feedback voltage VFB of not less than a predetermined value occurs, so that a voltage which is the sum of the conventional gate-emitter voltage Vge and the feedback voltage VFB becomes the current self-feedback gate-emitter voltage Vge. For this reason, the degree of change of the current self-feedback gate-emitter voltage Vge is low compared with that of the conventional gate-emitter voltage Vge.

Thereby, the degree of change of the collector current Ic is suppressed compared with the conventional one, so that as shown in FIG. 4(D), the surge voltage is also suppressed compared with the conventional one (see FIG. 3(A)).

As described above, by applying the "di/dt self-feedback operation", the degree of change of the current self-feedback gate-emitter voltage Vge is automatically adjusted in each section, so that the effect can be produced of reducing the surge voltage while suppressing the increase in switching loss. That is, the effect can be grasped an effect of being able to improve the trade-off characteristic of the surge voltage and switching loss.

Figure 5:
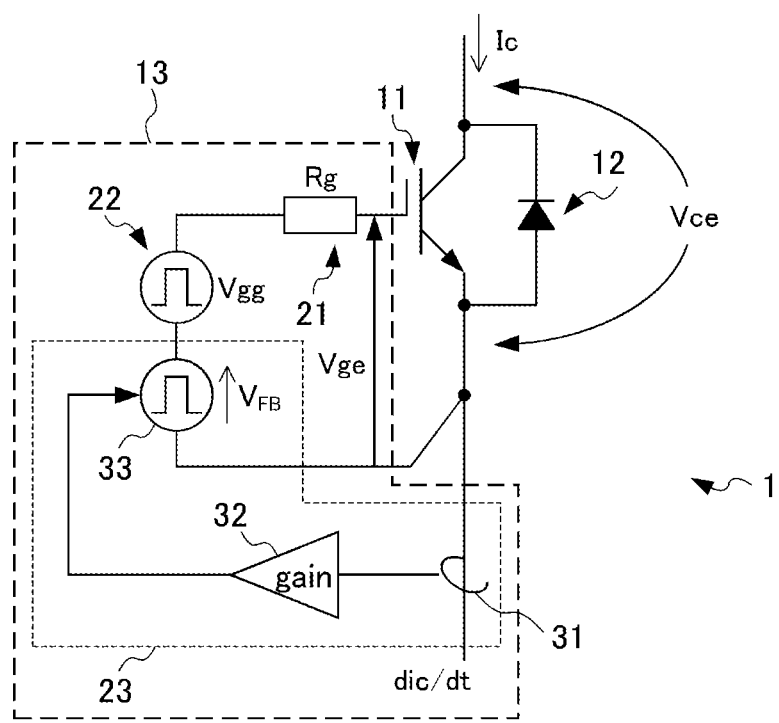
FIG. 5 is a view showing the schematic structure of a turning off basic model where the "di/dt self-feedback operation" is applied at the time of turning off, as the electronic circuit of FIG. 1.

FIG. 5 is a view showing the schematic structure of the embodiment of the electronic circuit 1 including the semiconductor device driving circuit 13 when the above-described "di/dt self-feedback operation" is applied at the time of turning off.

Comparing FIG. 1 and FIG. 5, of the elements of the electronic circuit 1, the elements other than the di/dt feedback portion 23 are the same. That is, FIG. 5 is different from FIG. 1 in that an example of the structure of the di/dt feedback portion 23 is shown. Therefore, the difference from FIG. 1, that is, the structure of the di/dt feedback portion 23 will be described.

The electronic circuit 1 when the "di/dt self-feedback operation" is applied at the time of turning off is embodied (mounted) in various kinds of forms on the basis of the structure shown in FIG. 5. Therefore, the structure of the electronic circuit 1 shown in FIG. 5 will hereinafter be referred to as "turning-off basic model".

The di/dt feedback portion 23 has a di/dt detection portion 31, a gain portion 32 and a voltage source 33.

The di/dt detection portion 31 detects the time change, that is, the temporal differentiation value dIc/dt of the collector current Ic of the IGBT 11.

The gain portion 32 multiplies the temporal differentiation value dIc/dt detected by the di/dt detection portion 31, by a predetermined gain.

The voltage source 33 outputs, as the feedback voltage VFB, a voltage of a magnitude corresponding to the temporal differentiation value dIc/dt multiplied by the predetermined gain by the gain portion 32.

Figure 6:
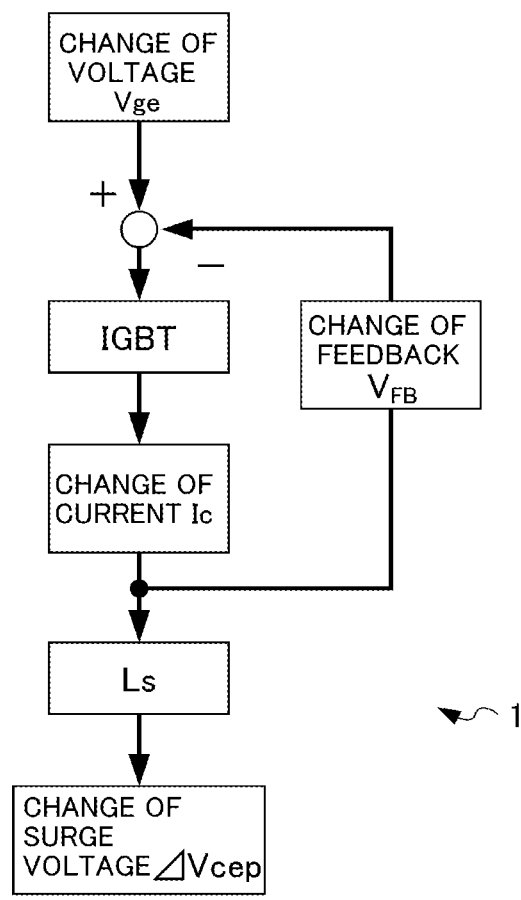
FIG. 6 is a flowchart of the turning off basic model of the electronic circuit of FIG. 5.

FIG. 6 is a flowchart of the turning-off basic model of the electronic circuit 1 of FIG. 5.

In FIG. 6, there has previously been a flow in one direction (the downward direction in the figure) to when a change of the gate-emitter voltage Vge due to the turning off of the IGBT 11 becomes a change of the collector current Ic through the IGBT 11 and becomes a surge voltage Vcep through a reactance Ls. Therefore, such a flow will hereinafter be referred to as "conventional flow".

In the turning off basic model, to such a conventional flow, further, a change of the feedback voltage VFB corresponding to the change of the collector current Ic is negatively fed back, and is added to the change of the gate-emitter voltage Vge.

FIGS. 7(A) to 7(D) are timing charts showing results of the operation at the turning off of each of the turning off basic model of the electronic circuit 1 of FIGS. 5 and 6 and an electronic circuit that operates according to the conventional flow (hereinafter, referred to as "conventional electronic circuit").

FIG. 7(A) is a timing chart of the gate-emitter voltage Vge.
FIG. 7(B) is a timing chart of the collector current Ic.
FIG. 7(C) is a timing chart of the feedback voltage VFB.
FIG. 7(D) is a timing chart of the collector-emitter voltage Vce.

In FIGS. 7(A), 7(B) and 7(D), the solid line represents the waveform of the turning off basic model of the electronic circuit 1, and the broken line represents the waveform of the conventional electronic circuit. Since the feedback voltage VFB is absent in the conventional electronic circuit, naturally, the feedback voltage VFB shown in FIG. 7(C) is one by the turning off basic model of the electronic circuit 1.

Since a detailed principle is as described above with reference to FIG. 4, it will briefly be described here.

In the section before the start of decrease of the collector current Ic in FIG. 7(B), that is, in the section before the "action section" in the figure, as shown in FIG. 7(C), the feedback voltage VFB does not occur in the turning off basic model of the electronic circuit 1.

For this reason, as shown in FIG. 7(A), the gate-emitter voltage Vge (the waveform of the solid line) of the turning off basic model of the electronic circuit 1 changes substantially similarly to the gate-emitter voltage Vge (the waveform of the broken line) of the conventional electronic circuit.

Consequently, as shown in FIG. 7(D), the rising speed of the collector-emitter voltage Vce (the waveform of the solid line) of the turning off basic model of the electronic circuit 1 is substantially as steep as that of the collector-emitter voltage Vce (the waveform of the broken line) of the conventional electronic circuit.

Thereby, the switching loss of the turning off basic model of the electronic circuit 1 can be maintained at a low level substantially the same as that of the conventional electronic circuit.

On the other hand, in the section where the collector current Ic is decreasing in FIG. 7(B), that is, in the "action section" in the figure, as shown in FIG. 7(C), the feedback voltage VFB occurs in the turning off basic model of the electronic circuit 1.

For this reason, as shown in FIG. 7(A), the gate-emitter voltage Vge (the waveform of the solid line) of the turning off basic model of the electronic circuit 1 is the sum of the gate-emitter voltage Vge (the waveform of the broken line) of the conventional electronic circuit and the feedback voltage VFB. Consequently, the degree of change of the gate-emitter voltage Vge (the waveform of the solid line) of the turning off basic model of the electronic circuit 1 is low compared with that of the gate-emitter voltage Vge (the waveform of the broken line) of the conventional electronic circuit.

As a result, as shown in FIG. 7(B), the degree of change of the collector current Ic (the waveform of the solid line) of the turning off basic model of the electronic circuit 1 is suppressed compared with that of the collector current Ic (the waveform of the broken line) of the conventional electronic circuit.

Thereby, as shown in FIG. 7(D), the surge voltage Vcep (difference in the height of the waveform of the solid line) of the turning off basic model of the electronic circuit 1 is suppressed compared with that of the surge voltage Vcep (difference in the height of the waveform of the broken line) of the conventional electronic circuit.

FIG. 8 is a view showing an example of the relationship between the surge voltage and the loss at the time of turning off of each of the turning off basic model of the electronic circuit 1 and the conventional electronic circuit.

In FIG. 8, the longitudinal axis represents the surge voltage Vcep, and the lateral axis represents the switching loss. The solid line is a curve connecting plotted actual measured values when the feedback gain is changed, with respect to the turning off basic model of the electronic circuit 1. On the other hand, the broken line is a curve connecting plotted actual measured values when the feedback gain is changed, with respect to the conventional electronic circuit.

As shown in FIG. 8, by optimizing the feedback gain of the turning off basic model of the electronic circuit 1, for example, by adopting the feedback gain corresponding to the plots represented by the hollow arrowheads in the figure, compared with the conventional circuit, the surge voltage Vcep can significantly be suppressed without the switching loss being increased.

As the actual measurement, it has turned out that the higher the turning off speed of the IGBT 11 is, the higher the effect of improving the surge voltage Vcep is.

Next, referring to FIG. 9, a form of mounting of the turning off basic model of the electronic circuit 1 of FIGS. 5 and 6 will be described.

Figure 9:
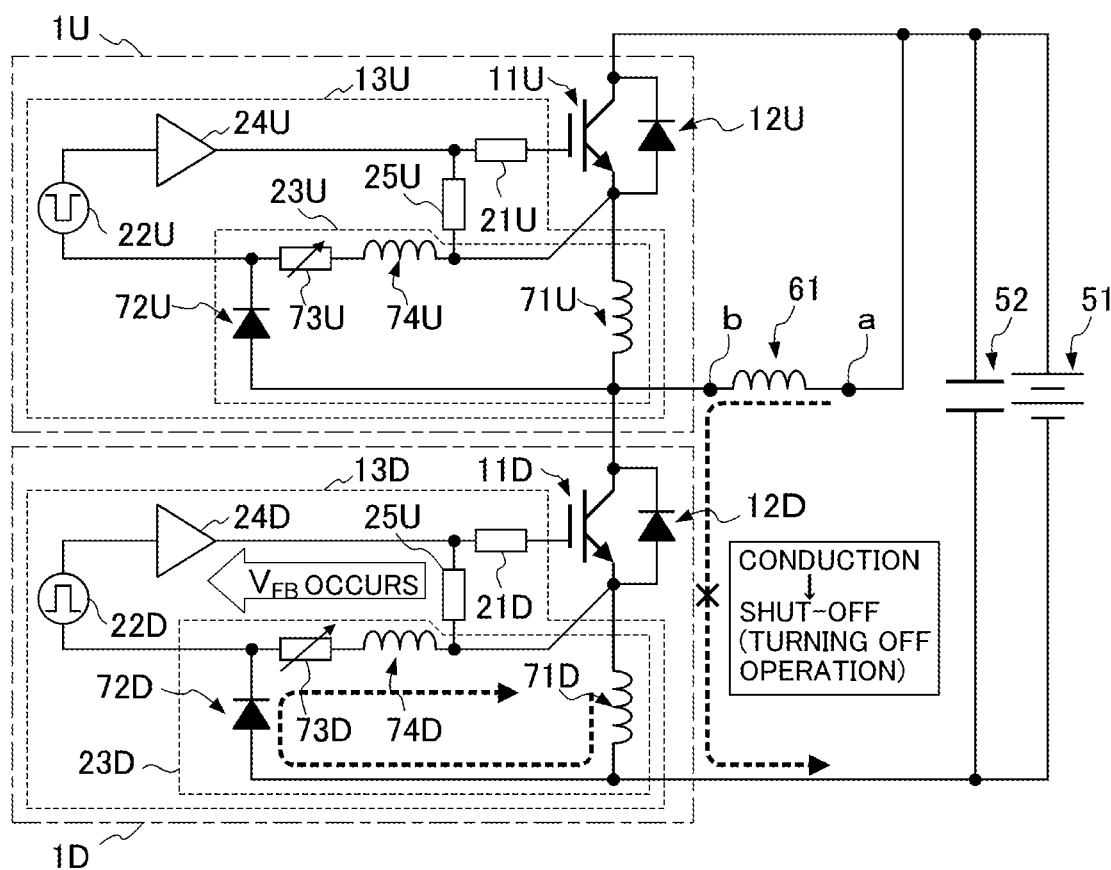
FIG. 9 is a view showing the schematic structure of a mounting form of the turning off basic model of FIG. 6.

FIG. 9 shows the structure of part of an inverter provided with electronic circuits 1U and 1D.

As shown in FIG. 9, an IGBT 11U of the electronic circuit 1U and an IGBT 11D of the electronic circuit 1D are connected in series in the same direction, and the series connection is parallel-connected to a main circuit power source 51 and a smoothing capacitor 52. Specifically, the positive terminal of the main circuit power source 51 is connected to the collector side of the IGBT 11U of the electronic circuit 1U, and the negative terminal of the main circuit power source 51 is connected to the emitter side of the IGBT 11D of the electronic circuit 1D.

For example, when the present inverter is adopted as the electric vehicle inverter, with the series connection of the IGBT 11U of the electronic circuit 1U and the IGBT 11D and the electronic circuit 1D as one unit, for three phases of load 61 of the synchronous electric motor, a plurality of units, for example three units, are used in a state of being connected in parallel.

In the following description, when it is unnecessary to make a distinction between the electronic circuit 1U and the electronic circuit 1D, they will be referred to merely as the "electronic circuit 1" with the letters "U" and "D" being omitted. When they are called "electronic circuit 1", the letters "U" and "D" will also be omitted from the reference designations of the other elements.

The semiconductor device driving circuit 13 is further provided with a gain portion 24 and a resistor 25 in addition to the gate resistor 21 to the di/dt feedback portion 23 described above with reference to FIG. 1, etc.

The gain portion 24 is connected between, of the terminals of the voltage source 22, the terminal on the side of the gate of the IGBT 11 and, of the terminals of the gate resistor 21, the terminal on the side opposite to the gate of the IGBT 11. The resistor 25 is connected between, of the terminals of the gate resistor 21U, the terminal on the side opposite to the gate of the IGBT 11 and the emitter of the IGBT 11.

The resistor 25 is a termination resistor (termination function) of the gate, and provided for safety's sake.

The di/dt feedback portion 23 is provided with a reactance 71, a diode 72, a variable resistor 73 and a reactance 74.

While an element (part) may be adopted as the reactance 71, in the present embodiment, it is a floating wiring inductance component that is always parasitic in the emitter of the IGBT 11. Likewise, while an element (part) may be adopted as the reactance 74, in the present embodiment, it is a wiring inductance component between the semiconductor device driving circuit 13 and the IGBT 11.

Therefore, the elements (parts) necessary when the di/dt feedback portion 23 is mounted on the semiconductor device driving circuit 13 are only the diode 72 and the variable resistor 73.

The diode 72 is constituted, for example, by a schottky barrier diode, and has its cathode connected to, of the terminals of the voltage source 22, the terminal on the side of the emitter of the IGBT 11, and its anode connected to the emitter of the IGBT 11.

The variable resistor 73 is connected between, of the terminals of the resistor 25, the terminal on the side of the emitter of the IGBT 11 and, of the terminals of the voltage source 22D, the terminal on the side of the emitter of the IGBT 11.

Comparing the turning off basic model of the electronic circuit 1 of FIG. 5 and the electronic circuit 1 of the structure of FIG. 9, the di/dt detection portion 31 of FIG. 5 corresponds to the floating inductance component as the reactance 71 of FIG. 9.

The gain portion 32 of FIG. 5 corresponds to a part multiplied by the product of the overall voltage gain (the control gain Again described with reference to FIG. 2) of the semiconductor device driving circuit 13 including the variable resistor 73 of FIG. 9 and the mutual conductance gm of the IGBT 11, as the feedback gain.

The voltage source 33 of FIG. 5 corresponds to a part up to where the current based on the voltage energy released from the reactance 71 flows into the driving circuit through the diode 72, that is, a part where the feedback voltage VFB is added to the gate-emitter voltage Vge of the IGBT 11.

In this case, the variable resistor 73 delivers the function of adjusting the feedback gain. Moreover, the reactance 74 delivers the function of adjusting the feedback time constant.

Now, the "di/dt self-feedback operation" by the di/dt feedback portion 23 of the above-described structure of FIG. 9 will be described.

The IGBT 11U of the electronic circuit 1U and the IGBT 11D of the electronic circuit 1D are driven by the semiconductor device driving circuit 13U of the electronic circuit 1U and the semiconductor device driving circuit 13D of the electronic circuit 1D, respectively, in such a way that when one is in conduction state, the other is in shut-off state.

The example of FIG. 9 shows the connection condition of the load 61 when the IGBT 11U of the electronic circuit 1U is in shut-off state and the IGBT 11D of the electronic circuit 1D is in conduction state. That is, in the initial state of the example of FIG. 9, current flows in the order of the positive terminal of the main circuit power source 51, the terminal a and terminal b of the load 61, the IGBT 11D of the electronic circuit 1D, and the negative terminal of the main circuit power source 51.

It is assumed that in such an initial state, with the electronic circuit 1U held in the resting state, in the electronic circuit 1D, the IGBT 11D is turned off by the semiconductor device driving circuit 13D after turned on.

In this case, the time change, that is, the temporal differentiation value dIc/dt of the collector current Ic when the IGBT 11D is turned off is temporarily stored in the reactance 71D, and is then released as the voltage energy. The current based on the released voltage energy flows into, of the terminals of the voltage source 22D, the terminal on the side of the emitter of the IGBT 11D through the diode 72D, whereby the value of the gate-emitter voltage Vge of the IGBT 11D increases by the value of the feedback voltage VFB that the voltage proportional to the temporal differentiation value dIc/dt becomes. That is, the feedback voltage VFB is added.

The feedback voltage VFB in this case is expressed by the following expression (12):

$$VFB = -Ls \cdot dIc/dt \tag{12}$$

In the opposite case, that is, when the IGBT 11U is turned off by the semiconductor device driving circuit 13U in the electronic circuit 1U, a completely similar "di/dt self-feedback operation" is performed by the di/dt feedback portion 23U on the side of the semiconductor device driving circuit 13U.

According to the above-described present embodiment, the following effects (1) and (2) can be produced:

(1) The semiconductor device driving circuit 13 of the electronic circuit 1 of the present embodiment is provided with the di/dt feedback portion 23 capable of performing the "di/dt self-feedback operation".

Thereby, the trade-off characteristic of the surge voltage and switching loss can be improved.

(2) In particular, by applying the "di/dt self-feedback operation" at the time of turning off, that is, by applying the turning off basic model of the electronic circuit 1 of FIG. 5, at the time of turning off, the surge voltage can be suppressed more significantly than ever before without the switching loss being increased more than ever before.

The suppression of the surge voltage results in an effect of enabling the IGBT 11 to operate at up to a voltage close to a withstand voltage. Moreover, the maintenance of the switching loss (not allowing the switching loss to increase) suppresses the manufacturing variation of the IGBT 11, which results in an effect of reducing the design margin to reduce the overall size and cost of the electronic circuit 1.

Further, by adopting the electronic circuit 1 of the structure of FIG. 9, as the feedback gain at the di/dt feedback portion 23, the product of the overall voltage gain of the semiconductor device driving circuit 13 including the variable resistor 73 (the control gain Again described with reference to FIG. 2) and the mutual conductance gm of the IGBT 11 can be used as it is. Thereby, the following effects (3) and (4) are obtained:

(3) Such an effect of the feedback gain and the feedback of the time change, that is, the temporal differentiation value dIc/d of the collector current Ic of the IGBT 11 produces an effect of absorbing the variation of the performance of the IGBT 11 and the manufacturing variation.

Consequently, it is unnecessary to adjust each individual IGBT 11.

Moreover, in cases such as when the electronic circuit 1 of the present embodiment is mounted as a power module for driving a three-phase alternating current motor with the load 61 as one phase of load, three series connections of two IGBTs 11 are prepared, and these three series connections are connected in parallel. As described above, even when a plurality of IGBTs 11 are connected in parallel, it is unnecessary to sort or adjust a plurality of IGBTs 11.

(4) Since the mutual conductance gm and switching speed that will be improved when the IGBT 11 is technologically evolved in the figure can be used as the feedback gain as they are, the degree of the above-mentioned effects (1) and (2) can further be enhanced.

Further, by adopting the electronic circuit 1 of the structure of FIG. 9, the following effect (5) can also be produced:

(5) Of the elements of the di/dt feedback portion 23, the reactance 71 and the reactance 74 can be implemented by the floating inductance of the circuit and the wiring inductance of the printed circuit board that are unavoidable in the structure of the electronic circuit 1. The other elements of the di/dt feedback portion 23 can also be implemented by a passive element such as the diode 72 constituted by a schottky barrier diode or the like, or the variable resistor 73.

That is, the di/dt feedback portion 23 can be implemented without any addition of a new passive element, and an active gate control can be implemented by the semiconductor device driving circuit 13 provided with the di/dt feedback portion 23.

As described above, the semiconductor device driving circuit 13 can be implemented without any addition of a new passive element, so that the semiconductor device driving circuit 13 is small in size and extremely resistant to breakdown.

The present invention is not limited to the above-described embodiment, and modifications, improvements and the like within the scope where the object of the present invention is attainable are embraced by the present invention.

For example, the present invention is applicable for driving not only the IGBT but also an arbitrary semiconductor device having a switching function.

That is, the present invention is widely applicable, for example, to a driving circuit that supplies a driving signal to the gate of a semiconductor device to bring into conduction or shut off a bus by the semiconductor device having a switching function of being turned on or off according to the voltage of the driving signal supplied to the gate and the collector and emitter of which are inserted on the bus. In this case, the driving circuit is provided with the feedback portion that generates a feedback voltage based on the time change of the current flowing on the bus and applies the feedback voltage as part of the voltage of the driving signal.

In other words, the present invention is applicable not only to inverters used for electric vehicles, electric trains, industrial apparatuses and the like but also to arbitrary current switches using an arbitrary voltage- or current-driven semiconductor device.

In particular, the structure of FIG. 9 is suitable as the structure of any current switches since the di/dt self-feedback operation" of the present invention is implemented with an extremely simple structure.

According to the above embodiment, a semiconductor device driving unit 13 may supply a driving signal to a gate of a semiconductor device 11 to bring into conduction or shut off a bus by the semiconductor device 11 having a switching function of being turned on or off according to a voltage Vge of the driving signal supplied to the gate and a collector and emitter of which are inserted on the bus. The semiconductor device driving unit 13 may include a feedback portion 23 configured to generate a feedback voltage VFE based on a time change dI/dt of a collector current Ic of the semiconductor device 11 and to apply the feedback voltage VFE as part of the voltage Vge of the driving signal, at a time of switching the semiconductor device 11 from on to off.

According to this structure, the feedback portion is capable of performing the "di/dt self-feedback operation".

Thereby, at the time of switching of the semiconductor device, the surge voltage can be reduced while the increase in switching loss is suppressed.

In particular, the surge voltage caused when the semiconductor device is turned off can be reduced while the increase in switching loss is suppressed.

In the above structure, the feedback portion 23 may generate the feedback voltage VFE based on a voltage energy which is released from a floating inductance that is parasitic in the emitter of the semiconductor device 11 after the time change dI/dt of the collector current Ic is temporarily stored in the floating inductance.

According to this structure, the feedback portion can be implemented by the floating inductance of the circuit and the wiring inductance of the printed circuit board that are unavoidable in the structure, and some passive elements.

That is, the feedback portion can be implemented without any addition of a new passive element, and an active gate control can be implemented by the semiconductor device driving unit provided with the feedback portion.

As described above, the semiconductor device driving unit can be implemented without any addition of a new passive element, so that the semiconductor device driving unit is small in size and extremely resistant to breakdown.

DESCRIPTION OF REFERENCE NUMERALS AND SIGNS

1 Electronic circuit
11 IGBT
12 FWD
13 Semiconductor device driving circuit
21 Gate resistor
22 Voltage source
23 Di/dt feedback portion
24 Gain portion
25 Resistor
31 Di/dt detection portion
32 Gain portion
33 Voltage source
51 Main circuit power source
52 Smoothing capacitor
61 Load
71 Reactance
72 Diode
73 Variable resistor
74 Reactance

What is claimed is:

1. A semiconductor device driving unit configured to supply a driving signal to a gate of a semiconductor device to bring into conduction or shut off a bus by the semiconductor device having a switching function of being turned on or off according to a final voltage of the driving signal supplied to the gate and a collector and emitter of which are inserted on the bus, the semiconductor device driving unit comprising:
a driving signal portion configured to generate an initial driving signal having an initial voltage; and
a feedback portion configured to generate a feedback voltage based on a time change of a collector current of the semiconductor device, and the feedback portion configured to add the feedback voltage to the initial voltage of the initial driving signal to generate the driving signal having the final voltage, at a time of switching the semiconductor device from on to off.

2. The semiconductor device driving unit according to claim 1, wherein the feedback portion is configured to generate the feedback voltage based on a voltage energy which is released from a floating inductance that is parasitic in the emitter of the semiconductor device after the time change of the collector current is temporarily stored in the floating inductance.

3. The semiconductor device driving unit according to claim 1, wherein the final voltage is equal to a sum of the initial voltage and the feedback voltage.

4. The semiconductor device driving unit according to claim 1, wherein the driving signal portion comprises:
a driving signal voltage source configured to output a voltage; and
a gate resistor,
wherein the driving signal voltage source includes a first terminal connected to the emitter and a second terminal connected to the gate through the gate resistor.

5. The semiconductor device driving unit according to claim 4, wherein the feedback portion comprises:
a detection portion configured to detect the time change of the collector current of the semiconductor device as a temporal differentiation value;
a gain portion configured to multiply the temporal differentiation value by a predetermined gain; and
a feedback voltage source configured to generate the feedback voltage in a magnitude of the temporal differentiation value multiplied by the predetermined gain.

6. The semiconductor device driving unit according to claim 5, wherein the feedback voltage source is connected to the driving signal portion between the driving signal voltage source and the gate resistor.

7. The semiconductor device driving unit according to claim 1, wherein the feedback portion comprises:
a detection portion configured to detect the time change of the collector current of the semiconductor device as a temporal differentiation value;
a gain portion configured to multiply the temporal differentiation value by a predetermined gain; and
a feedback voltage source configured to generate the feedback voltage in a magnitude of the temporal differentiation value multiplied by the predetermined gain.

8. A method of driving a semiconductor device having a switching function of being turned on or off according to a final voltage of a driving signal supplied to a gate thereof and a collector and emitter of which are inserted on a bus, the method comprising:
generating an initial driving signal having an initial voltage;
generating a feedback voltage based on a time change of a collector current of the semiconductor device; and
adding the feedback voltage to the initial voltage of the initial driving signal to generate the final voltage of the driving signal, the final voltage being equal to a sum of the initial voltage and the feedback voltage, when the semiconductor device is switched from on to off.

9. The method according to claim 8, wherein the feedback voltage is added to the initial voltage of the initial driving signal to generate the final voltage of the driving signal such that the final voltage of the driving signal is equal to a sum of the initial voltage and the feedback voltage.

* * * * *